(12) United States Patent
Voleti et al.

(10) Patent No.: US 12,394,655 B2
(45) Date of Patent: Aug. 19, 2025

(54) SUBSURFACE ALIGNMENT METROLOGY SYSTEM FOR PACKAGING APPLICATIONS

(71) Applicant: Applied Materials, Inc., Santa Clara, CA (US)

(72) Inventors: Venkatakaushik Voleti, San Jose, CA (US); Keith Buckley Wells, Santa Cruz, CA (US); Mehdi Vaez-Iravani, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 241 days.

(21) Appl. No.: 17/993,096

(22) Filed: Nov. 23, 2022

(65) Prior Publication Data

US 2024/0170317 A1    May 23, 2024

(51) Int. Cl.
*H01L 21/68* (2006.01)
*H01L 23/00* (2006.01)

(52) U.S. Cl.
CPC ............ *H01L 21/681* (2013.01); *H01L 24/80* (2013.01); *H01L 2224/8013* (2013.01)

(58) Field of Classification Search
CPC . H01L 24/75; H01L 24/80; H01L 2224/8013; H01L 21/681; H01L 21/67288; G01N 2201/021; G01N 2201/063; G01N 21/4788; G01N 21/8851; G01N 21/9501; G03F 7/70633; G03F 7/70616
See application file for complete search history.

(56) References Cited

U.S. PATENT DOCUMENTS

| 6,917,421 | B1 * | 7/2005 | Wihl | G01B 11/0608 |
| | | | | 356/624 |
| 8,640,548 | B2 | 2/2014 | Wimplinger | |
| 9,618,329 | B2 * | 4/2017 | Weston | G01B 11/007 |
| 9,911,755 | B2 | 3/2018 | Yamazaki et al. | |
| 10,109,487 | B2 | 10/2018 | Kurz et al. | |
| 11,448,603 | B1 | 9/2022 | Norman et al. | |
| 2003/0081530 | A1 * | 5/2003 | Sato | G11B 7/1378 |

(Continued)

OTHER PUBLICATIONS

PCT International Search Report and Written Opinion for PCT/US2023/080265 dated Mar. 25, 2024.

(Continued)

*Primary Examiner* — Sang H Nguyen
(74) *Attorney, Agent, or Firm* — Moser Taboada (57) ABSTRACT

An apparatus for detecting metrology data in semiconductor packaging processes using fast focus and acquisition techniques to determine alignment metrology data for hybrid bonding. In some embodiments, the apparatus may include a source configured to illuminate a focal point with a wavelength selected from wavelengths greater than 1100 nm, an optical lens that forms an illumination beam when illuminated by the source, an acousto-optic scanner that moves the illumination beam back and forth in a scanning pattern, a splitter to allow the illumination beam to be directed at a metrology sampling location while allowing a reflection beam caused by the illumination beam to pass through the splitter to a detector, a set of optics configured to focus the illumination beam at one or more focal points in a Z direction to obtain subsurface images, and a substrate platform configured to hold a substrate and to move the substrate during scanning.

20 Claims, 4 Drawing Sheets

(56) References Cited

U.S. PATENT DOCUMENTS

| | | | |
|---|---|---|---|
| 2007/0252994 A1 | 11/2007 | Bijnen et al. | |
| 2008/0031509 A1* | 2/2008 | Heiden | G01B 11/0608 |
| | | | 382/145 |
| 2017/0207214 A1 | 7/2017 | Or-Bach et al. | |
| 2018/0149603 A1* | 5/2018 | Bhattacharyya | G01R 31/311 |
| 2018/0188633 A1* | 7/2018 | Chuang | G02F 1/3551 |
| 2018/0238675 A1* | 8/2018 | Wan | G01B 9/0203 |
| 2019/0041329 A1* | 2/2019 | Hill | G02B 27/286 |
| 2020/0249168 A1* | 8/2020 | Voleti | G02B 21/0084 |
| 2021/0118841 A1 | 4/2021 | Sen et al. | |
| 2021/0398940 A1* | 12/2021 | Kim | H01L 25/18 |
| 2022/0005715 A1* | 1/2022 | Lee | G03F 7/70633 |
| 2022/0187718 A1 | 6/2022 | Zach et al. | |
| 2023/0285554 A1 | 9/2023 | Zhang et al. | |

OTHER PUBLICATIONS

Duocastella et al., Acousto-optic systems for advanced microscopy, Journal of Physics: Photonics 3, 2021, 16 pages, https://doi.org/10.1088/2515-7647/abc23c.

* cited by examiner

SUBSURFACE ALIGNMENT METROLOGY SYSTEM FOR PACKAGING APPLICATIONS

FIELD

Embodiments of the present principles generally relate to semiconductor processing of semiconductor substrates.

BACKGROUND

During semiconductor manufacturing, aligning of masks is typically accomplished by using systems that step to a location, obtain data from that location, and then move on to the next location. The inventors have observed, however, that in packaging applications, thousands of locations may need to be processed on a single substrate and mechanically based step and repeat systems are not fast enough to process the large number of locations without a substantial impact on throughput.

Accordingly, the inventors have provided methods, apparatus, and systems for alignment metrology conducive to packaging applications.

SUMMARY

Methods, apparatus, and systems for providing alignment metrology for packaging applications are provided herein.

In some embodiments, an apparatus for detecting metrology data may comprise a source using a laser configured to illuminate a focal point through silicon where a wavelength of the source is selected from wavelengths greater than 1100 nm and configured to generate a diffraction-limited focus for subsurface imaging, an optical lens configured to form an illumination beam when illuminated by the source, an acousto-optic scanner configured to move the illumination beam back and forth in a scanning pattern, a splitter configured to allow the illumination beam to be directed at a metrology sampling location while allowing a reflection beam caused by the illumination beam to pass through the splitter to a detector, a set of optics configured to focus the illumination beam at a focal point in a Z direction to obtain subsurface images, and a substrate platform configured to hold a substrate and to move the substrate in an X direction and a Y direction based on a metrology data acquisition pattern where the apparatus is configured to obtain metrology data for a semiconductor packaging process.

In some embodiments, a system for correcting packaging alignment errors may comprise an apparatus for detecting metrology data that may include at least one source using a laser configured to illuminate a focal point through silicon where a wavelength of the source is configured to generate a diffraction-limited focus for subsurface imaging, at least one optical lens configured to form at least one illumination beam when illuminated by the at least one source, at least one scanner configured to move the at least one illumination beam back and forth in a scanning pattern, at least one splitter configured to allow the at least one illumination beam to be directed at a metrology sampling location while allowing at least one reflection beam caused by the at least one illumination beam to pass through the at least one splitter to at least one detector, at least one set of optics configured to focus the at least one illumination beam at one or more focal planes in a Z direction to obtain subsurface images, and a substrate platform configured to hold a substrate and to move the substrate in an X direction and a Y direction based on a metrology data acquisition pattern where the apparatus is configured to obtain metrology data for a semiconductor packaging process, a first controller in communication with the at least one scanner and the at least one set of optics and configured to automatically adjust the scanning pattern and a focus based on an amount of metrology data for a particular location on the substrate, the at least one detector configured to receive the at least one reflection beam and generate subsurface images, an alignment correlator in communication with the at least one detector and configured to determine alignment errors from the subsurface images from the at least one detector, and a second controller in communication with a hybrid bonder and configured to adjust alignment of chips on the substrate based on the alignment errors from the alignment correlator.

In some embodiments, an apparatus for detecting metrology data may comprise a source using a laser configured to illuminate a focal point through silicon where a wavelength of the source is selected from wavelengths greater than 1100 nm and configured to generate a diffraction-limited focus for subsurface imaging, an optical lens configured to form an illumination beam when illuminated by the source, an acousto-optic scanner configured to move the illumination beam back and forth in a scanning pattern, a splitter configured to allow the illumination beam to be directed at a metrology sampling location while allowing a reflection beam caused by the illumination beam to pass through the splitter to a detector, a set of optics configured to focus the illumination beam at one or more focal points in a Z direction to obtain subsurface images where the set of optics includes correction for spherical aberrations caused by the illumination beam passing through at least one surface plane, a substrate platform configured to hold a substrate and to move the substrate in an X direction and a Y direction based on a metrology data acquisition pattern, and a controller in communication with the acousto-optic scanner and the set of optics and configured to automatically adjust the scanning pattern and a focus based on an amount of metrology data for a particular location on the substrate where the apparatus is configured to obtain metrology data for a hybrid bonder in a semiconductor packaging process.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods, apparatus, and systems provide a fast and efficient alignment metrology solution for subsurface alignment of targets that is compatible with the high demands found in packaging applications such as, but not limited to, hybrid bonding and the like. Non-mechanical scanning techniques are employed to allow for quicker data acquisition at each scanning location while providing adjustable data acquisition scans. In critical locations, metrology scanning can be adjusted to obtain high precision (more data) and readjusted in low critical areas to reduce data throughput, decreasing overall data processing demands. Step and repeat type metrology systems are typically based on mechanical mechanisms that are used to scan and obtain data from a surface of a substrate. The acceleration and deceleration of the mechanical mechanism impacts the speed at which the step and repeat type metrology system can obtain data, increasing the overall processing time. The inventors have found that by eliminating the mechanical aspects and employing a non-mechanical scanning apparatus, the data acquisition speed can be significantly enhanced.

An ever-pressing problem in hybrid bonding and packaging applications is the need to ensure precise positioning of bonding pads of two connecting bodies. Although in absolute terms the requirements are not as stringent as requirements needed in usual IC manufacturing, the issue nevertheless poses a significant problem, since the bonding pads are below the top silicon chip, and, thus, not viewable in the visible light range. Infrared is used to allow a metrology station to see through and below a chip to expose alignment marks on the substrate on which the chip has been bonded. To achieve any reasonable throughput, alignment metrology for packaging applications requires fast techniques, approaching thousands of measurements per hour.

Traditional techniques to perform the task of subsurface imaging and alignment have been carried out using high-resolution short-wave IR (SWIR) microscopy in a "step and repeat" imaging system. The step and repeat approach is unacceptably slow as the number of inspection sites increases. The inventors have found that no suitable SWIR cameras exist that can operate in a smooth continuous motion in order to achieve the required throughput needed in packaging applications. SWIR line scan cameras do exist. However, the inventors found that such sensors demand a focused line illumination requiring laser radiation which cannot be used directly due to the generation of unacceptable levels of speckle in the image. The inventors further found that attempts to "speckle-bust" the laser radiation causes the output light to not be focused tightly, thus, negating the possibility of fast and high-resolution imaging.

The inventors discovered a solution to the challenging issues by using a SWIR spot scanning apparatus in a high-resolution, reflection mode to generate subsurface images of the targets (e.g., fiducials, etc.). There are difficulties associated with the appropriate light source or detector that plague the operation of such a system in field or line-imaging mode in the SWIR regime. The inventors found that the difficulties can be overcome for packaging applications when used with single point detectors with adequate performance and laser sources operating at approximately 1100 nm wavelengths and longer that can generate a small, diffraction-limited focus. By incorporating non-mechanical scanning apparatus such as, but not limited to, acousto-optic scanners operating in near-IR, the speed of the scanning is dramatically increased.

Figure 1:
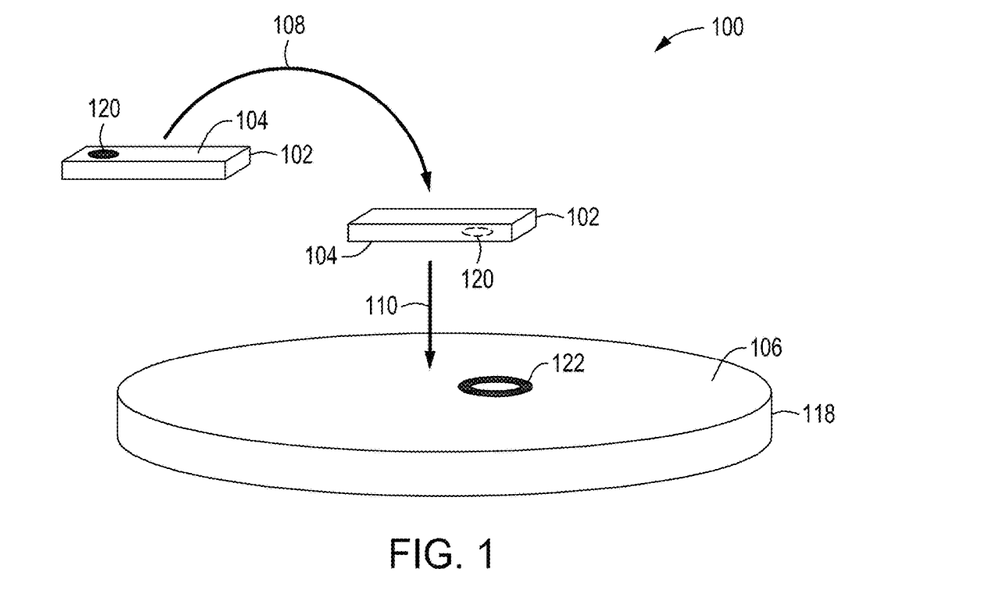
FIG. 1 depicts an isometric view of chips bonded to a substrate in accordance with some embodiments of the present principles.
Figure 2:
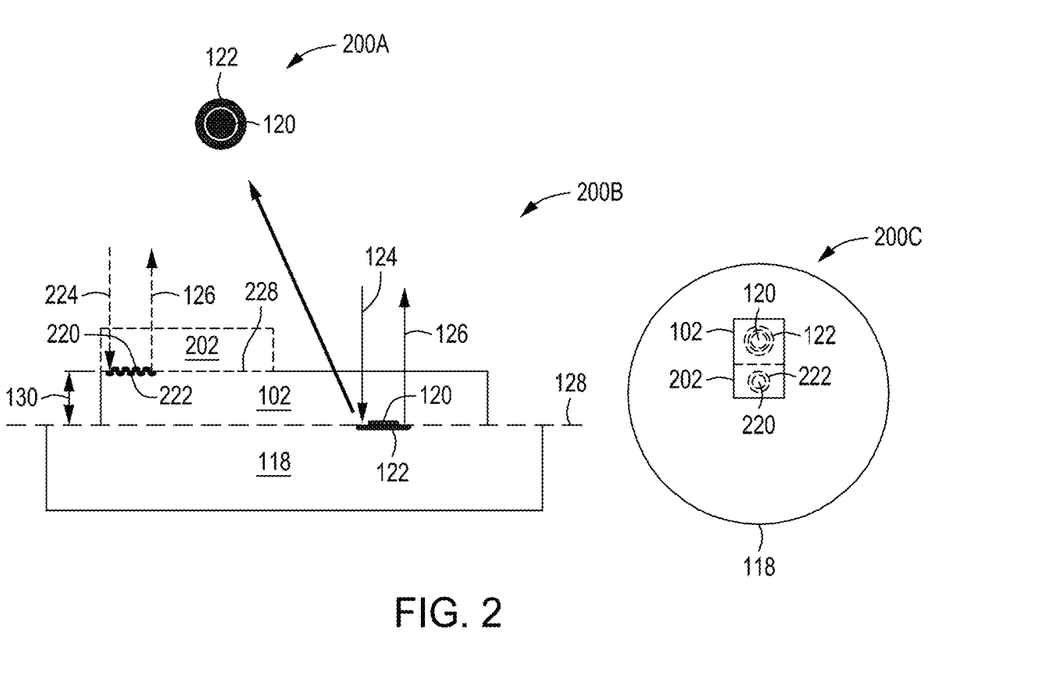
FIG. 2 depicts a cross-sectional view and top-down views of alignment of chips bonded to a substrate in accordance with some embodiments of the present principles.

The fact that packaging processes require subsurface imaging presents unique challenges compared to other metrology data gathering systems. FIG. 1 depicts an isometric view 100 of a first chip 102 bonded to a substrate 118 in accordance with some embodiments. The first chip 102 typically originates from a component substrate (not shown). During hybrid bonding, the first chip 102 is ejected and picked from the component substrate and flipped 108 upside down such that the top surface 104 of the first chip 102 with a first alignment mark 120 (or fiducial) becomes a bottom surface or chip bonding surface that is bonded to an upper surface 106 or substrate bonding surface of the substrate 118. The upper surface 106 of the substrate 118 typically has a second alignment mark 122 that is used to align with the first alignment mark 120 of the first chip 102 during bonding 110. FIG. 2 depicts a cross-sectional view 200B and a top-down view 200A of aligned fiducial marks and a top-down view 200C of the first chip 102 bonded to the substrate 118 in accordance with some embodiments. For the examples depicted in FIGS. 1 and 2 and not meant to be limiting, the first alignment mark 120 on the first chip 102 is a circle and the second alignment mark 122 on the substrate 118 is a ring. For the example, a proper alignment is when the circle of the first alignment mark 120 is centered within the ring of the second alignment mark 122 of the substrate 118 as depicted in top-down view 200A and top-down view 200C. When the first chip 102 is bonded to the substrate 118, the first alignment mark 120 and the second alignment mark 122 are essentially co-planar along plane 128 as depicted in the cross-sectional view 200B.

To determine if proper alignment of the first chip 102 and the substrate 118 has been accomplished after bonding, a first illumination beam 124 is set to penetrate through the first chip 102 to a depth 130 near the upper surface 106 of the substrate 118 and the bonding surface of the first chip 102 at plane 128. A first reflection beam 126 is then captured by a detector (not shown, see FIG. 4) which processes a set of image data from the first reflection beam 126. The detector or an associated image analyzer (alignment correlator 446 of FIG. 4) compares the image data of the first alignment mark 120 of the first chip 102 to the second alignment mark 122 of the substrate 118 and determines if an alignment error has occurred. The image data may also be compared to historical image/alignment error data to determine an overall alignment error including rotational errors (angle alignment error caused by rotational skewing of the bonded chip relative to the substrate, see, e.g., FIG. 3, view 300C).

Some packaging processes have stacked chips which require multi-planar subsurface imaging which presents unique challenges. For example, the system should be capable of imaging at multiple depths or focal points as needed. In some embodiments, an optional second chip 202 may be bonded to the first chip 102 as depicted in FIG. 2. A fourth alignment mark 222 of the optional second chip 202 is used to align with a third alignment mark 220 of the first chip 102 during bonding 110. For the example depicted in FIG. 2 and not meant to be limiting, the third alignment mark 220 on the optional second chip 202 is a circle and the fourth alignment mark 222 on the first chip 102 is a ring. For the example, a proper alignment is when the circle of the third alignment mark 220 is centered within the ring of the fourth alignment mark 222 of the first chip similar to the top-down view 200A and as depicted in the top-down view 200C. When the optional second chip 202 is bonded to the first chip 102, the third alignment mark 220 and the fourth alignment mark 222 are essentially co-planar at the interface 228 of the bonded surfaces of the chips as depicted in the cross-sectional view 200B.

To determine if proper alignment of the first chip 102 and the second chip 202 has been accomplished after bonding, a second illumination beam 224 is set to penetrate through the optional second chip 202 to a depth of the interface 228 of the chips. A second reflection beam 226 is then captured by a detector (not shown, see FIG. 4) which processes a set of image data from the second reflection beam 226. The detector or an associated image analyzer (alignment correlator 446 of FIG. 4) compares the image data of the third alignment mark 220 of the optional second chip 202 to the fourth alignment mark 222 of the first chip 102 and determines if an alignment error has occurred. The image data may also be compared to historical image/alignment error data to determine an overall alignment error including rotational errors (angle alignment error caused by rotational skewing of the bonded chip relative to the substrate, see, e.g., FIG. 3, view 300C).

In more complex packaging processes, bonded single chips and bonded stacked chips may require multi-planar subsurface imaging to obtain fiducial alignment images as the fiducial alignment pairs may be located at different planes. In a cross-sectional view 300A of FIG. 3, a first chip 304 has been bonded to a substrate 302. The substrate 302 has fiducials or a first set of alignment marks 308 on a first surface 310. The first chip 304 has a second set of alignment marks 312 on a second surface 314 that are meant to align the first chip 304 to the substrate 302. To determine if proper alignment of the first chip 304 and the substrate 302 has been accomplished after bonding, at a first location 322 on the substrate 302, a first illumination beam 316 is set to penetrate through the first chip 304 to a first depth 318 near the first surface 310 of the substrate 302. A first reflection beam (not shown, see FIG. 4) is then captured by a detector (not shown, see FIG. 4) which processes a first set of image data from the first reflection beam. A second illumination beam 320 is adjusted such that the second illumination beam 320 reflects off of the second surface 314 and a second reflection beam (not shown) is received by the detector which processes a second set of image data. The detector or an associated image analyzer (alignment correlator 446 of FIG. 4) compares the sets of image data and determines if an alignment error has occurred. The process then continues to a second location 324 on the substrate 302 and repeated. The image data from the second location 324 may also be compared to the image/alignment error data from the first location 322 to determine an overall alignment error including rotational errors (angle alignment error caused by rotational skewing of the bonded chip).

Figure 3:
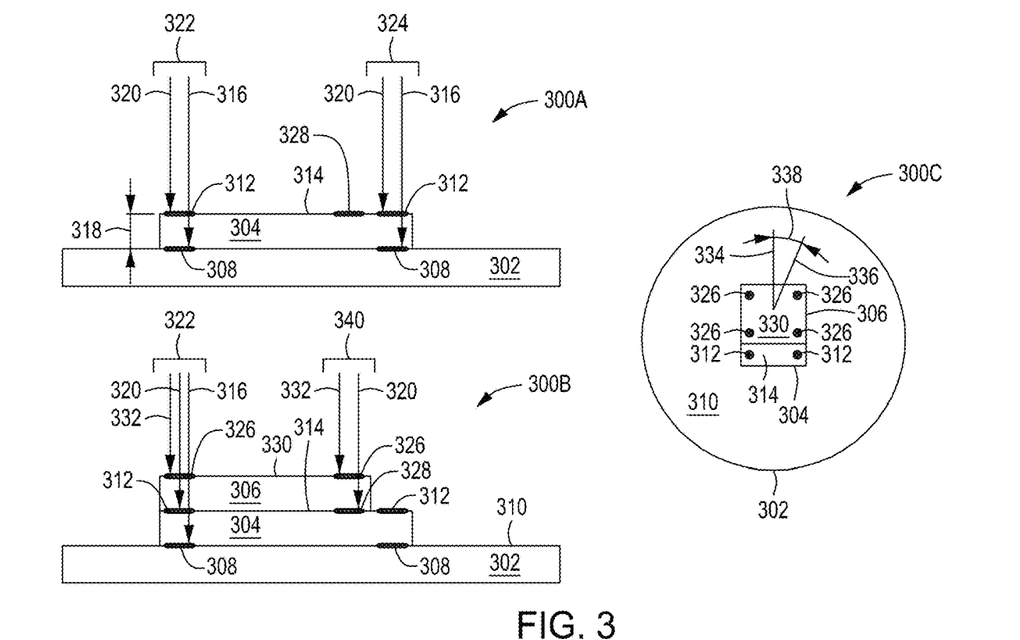
FIG. 3 depicts cross-sectional views and a top-down view of alignment of chips bonded to a substrate in accordance with some embodiments of the present principles.

In a cross-sectional view 300B of FIG. 3, a second chip 306 has been bonded to the first chip 304. The second chip 306 has a third set of alignment marks 326 on a third surface 330 of the second chip 306 that are meant to align the second chip 306 to the first chip 304. The third set of alignment marks 326 align with a fourth set of alignment marks 328 on the second surface 314 of the first chip 304 at a third location 340 and also one or more of the marks of the second set of alignment marks 312 on the second surface 314 of the first chip 304 at the first location 322. In cases where alignment overlap occurs in multiple bonding stacks, prior image data can be used to compare with newly acquired image data at a different depth. Given that the first illumination beam 316 produced image data regarding alignment marks of the first set of alignment marks 308 at the first location 322 and also that the second illumination beam 320 produced image data regarding alignment marks of the second set of alignment marks 312 at the first location 322, a third illumination beam 332 can be used to produce image data regarding the alignment marks of the third set of alignment marks 326 at the first location 322. The image data from each of the surfaces of the substrate 302, the first chip 304, and second chip 306 can be compared for the first location 322 without requiring repeating of the illumination beams at the different depth levels (focal points). In the case of the third location 340, the illumination beams at the depth of the second surface 314 and the third surface 330 can be repeated for the third location 340 to obtain alignment error data for the third set of alignment marks 326 to the fourth set of alignment marks 328 at the third location 340.

In a top-down view 300C of FIG. 3, the substrate 302 is depicted with the first chip 304 bonded to the substrate 302 and the second chip 306 bonded to the first chip 304. On the third surface 330 of the second chip 306, the third set of alignment marks 326 are visible. On the second surface 314 of the first chip 304, a portion of the second set of alignment marks 312 are visible. As an example, a desired orientation line 334 for the second chip 306 is used to compare with an actual (skewed) orientation line 336 with an error angle 338. The error angle 338 indicates positive or negative rotation from the desired orientation. Thus, both alignment errors and orientation errors can be determined from the image data obtained from the alignment marks. The illumination source must be able to penetrate through silicon materials while being fast focus adjustable to allow multiple focal points at different depths. In some circumstances, thousands of locations on the substrate 302 are required to be scanned in a timely manner. Despite the challenges presented, the inventors have overcome the obstacles to produce a fast-scanning apparatus with rapid focusing properties that allows metrology data such as bonding alignment data to obtained quickly and efficiently without slowing the packaging processes and substantially impacting yields. In addition, unique issues such as optical aberrations (e.g., spherical aberrations, etc.) caused by illuminating through surfaces are accounted for in the apparatus.

Figure 4:
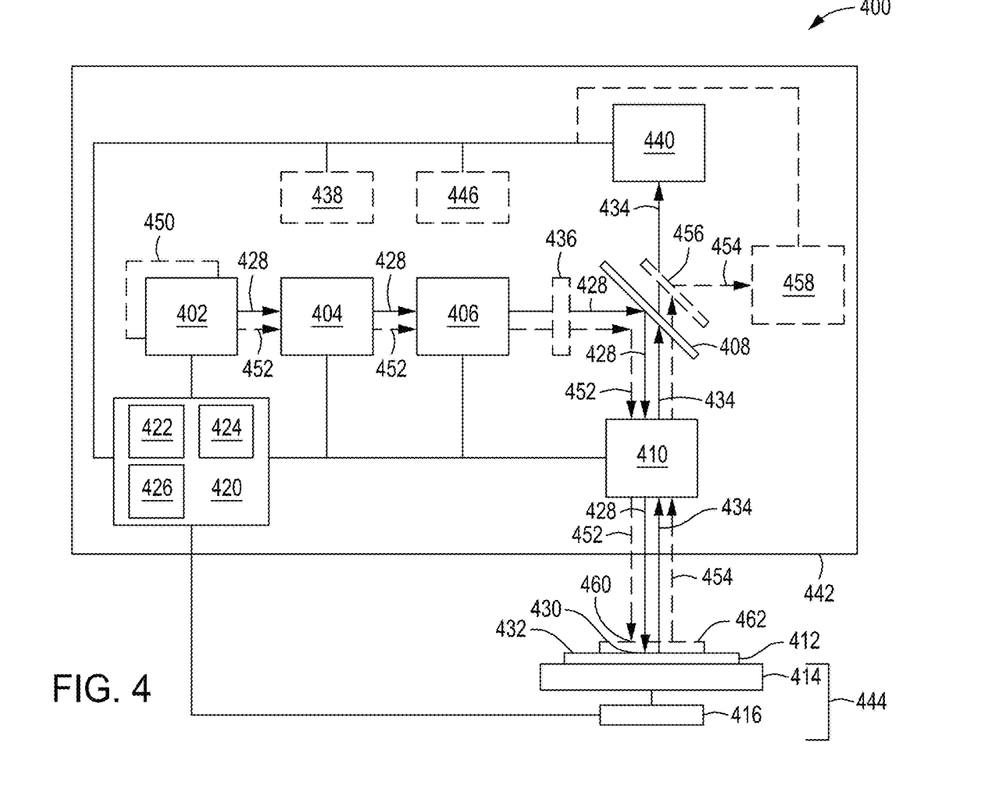
FIG. 4 depicts a cross-sectional view of a metrology system in accordance with some embodiments of the present principles.

FIG. 4 shows a depiction of a metrology system 400 consisting of an image detection apparatus 442 with an illumination source 402 (e.g., an IR laser source, etc.), beam forming optics 404 to shape the illumination beam 428, a scanner 406 (e.g., an acousto-optic scanner, a polygon scanner, a galvanometer scanner, etc.), a focusing objective 410 to position and focus the illumination beam 428 at a location on a substrate 412, and a detector 440 to generate high-resolution, subsurface images of samples through silicon material of the substrate 412 and/or chips, etc. bonded to the substrate 412. In some embodiments, an acousto-optic scanner is used to enhance the speed and control of the scanning without mechanical apparatus. The acousto-optic scanner may be implemented for maximum scanning speed in a single or dual chirped mode. In some embodiments, a mechanically based scanners such as, but not limited to, galvanometer scanners or polygon scanners can be used when maximum scanning speed is not required. For example, mechanically based scanners may be used with metrology systems having multiple illumination sources and the like. Images are generated by focusing the illumination beam 428 onto a location 430 on a surface 432 of the substrate 412 or on a surface of a chip bonded to the substrate (not shown, see FIGS. 2 and 3). In some embodiments, additional relay optics and/or magnification changer apparatus 436 may be employed after the scanner 406 and before a splitter 408 (illumination beam splitter or reflection beam splitter).

Figure 5:
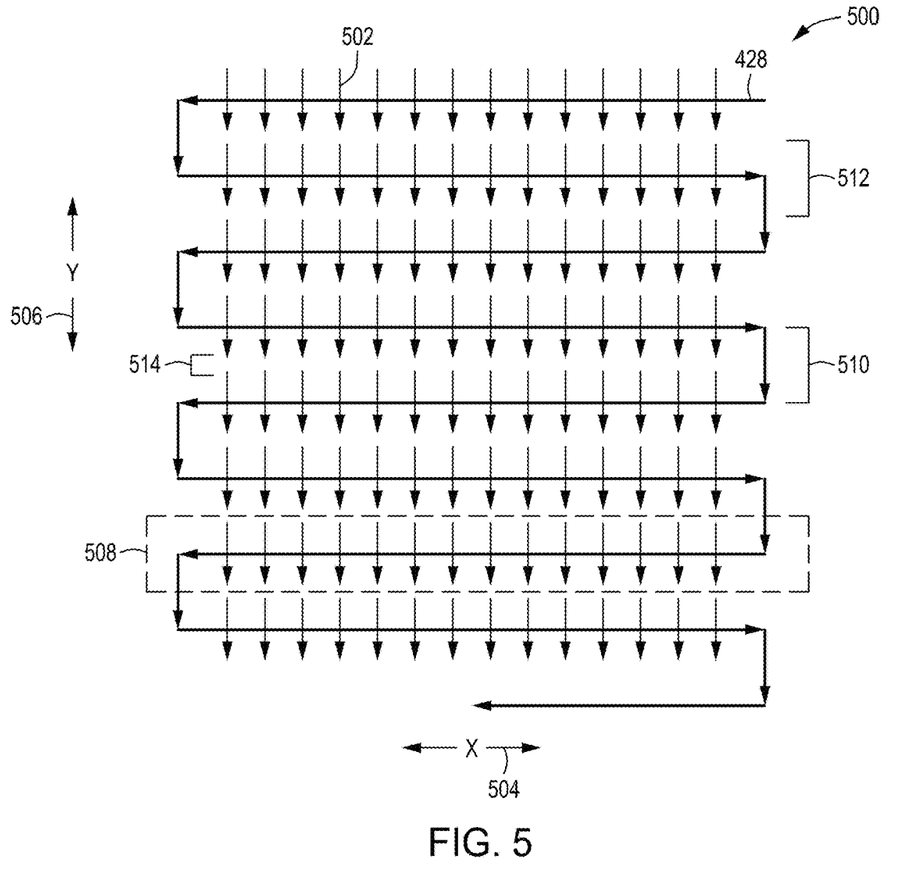
FIG. 5 depicts a top-down view of a scanning pattern in accordance with some embodiments of the present principles.
Figure 6:
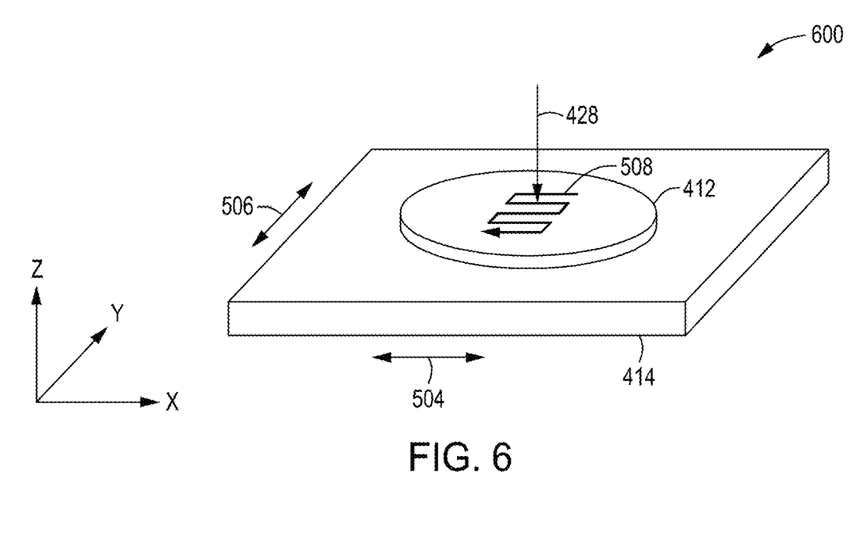
FIG. 6 depicts an isometric view of substrate support motion in accordance with some embodiments of the present principles.

The scanner 406 moves the illumination beam 428 in a fast scan in one direction while a substrate support 414 is moved by an actuator 416 slowly in an orthogonal direction to the fast scan in a raster fashion. The metrology system 400 also includes a substrate motion apparatus 444 for assisting in the scanning of a substrate/chip. For example, as depicted in a view 500 of FIG. 5, the illumination beam 428 travels in an X direction slowly while the fast scan 502 scans in an orthogonal direction to the X direction. The interface between the two surfaces of the bonded pieces is scanned in a swath 508. Multiple swaths are performed which start at the top of the image sample location and finish at the bottom. At the end of the swath 508, the position of the sample is advanced in the Y direction 506 by a distance 510 less than a width 512 of the swath 508 (in FIG. 5, the actual width of the swath has been reduced slightly for clarity as the orthogonal scanning arrows of each swath would overlay each other and detail would be lost). The process is repeated by scanning the sample in the opposite direction and so forth. Thus, an overlap 514 of a few pixels between any two adjacent swaths exists to ensure satisfactory imaging of the entire substrate 412. In some embodiments, as depicted in an isometric view 600 of FIG. 6, the actuator 416 (see FIG. 4) of the substrate support 414 moves the substrate 412 slower in an X direction 504 such that the illumination beam 428 forms a swath 508 on a desired location of the substrate 412 (or chip bonded to the substrate 412). When the swath 508 is completed, the actuator 416 moves the substrate support 414 in a Y direction 506 which is a distance less than the orthogonal scan width (width 512). The actuator 416 then moves in an opposite X direction so that another swath is formed.

During illumination of a target location with the illumination beam 428, a reflection beam 434 is produced that is used to form image data. The reflection beam 434 is redirected by the splitter 408 to allow the reflection beam 434 to be received by the detector 440. The detector 440 receives the reflection beam 434 and generates an image. The detector 440 may operate in conjunction with a store 438 where the images can be stored in a memory and recalled for later alignment comparisons and/or in conjunction with an alignment correlator 446 that receives multiple images from the detector and uses image overlay processes to determine alignment error locations and alignment error values (e.g., alignment shift, alignment rotational errors, etc.). In some embodiments, images are made by the detector 440 by taking greater than the Nyquist number of samples per point spread function (PSF), to render the alignment statistics independent of the precise location of any target. Thus, when assembled, the images of the targets are identical (in terms of information the images convey) to any non-scanning images obtained (such as images taken with a digital camera). The algorithmic strategies employed to perform measurements on the images (such as by the alignment correlator 446) can, therefore, use similar algorithmic strategies used for still images.

An illumination source used with the metrology system 400 should have a relatively narrow band for point scanning. Broadband light sources such as sources used with step and repeat metrology systems are not compatible with metrology systems of the present principles. Broadband light sources distribute the light energies across a 'broad band' of light and do not produce enough light at any frequency to enable efficient and strong light beams needed for the metrology systems of the present principles. In addition, broadband light sources tend to shift the lateral resolution towards the longer wavelengths. The inventors have found that the selected light source should have a wavelength selected from a range of wavelengths greater than 1100 nm with sufficient light penetration into the silicon (or other material being used in chip or substrate, etc.) that produces easily detectable reflected light at a desired focal plane. The deterministic factor is the amount of absorption of the wavelength in a material (e.g., chip or substrate material) which is also influenced by the thickness of the material. For example, shorter wavelengths may be used for thinner materials compared to thicker materials of the same material. For example, if silicon is the predominant material being bonded, a wavelength that is not substantially absorbed by the silicon should be selected (e.g., IR wavelengths). The inventors have found that light sources incorporating light emitting diodes or lasers and the like produce powerful, efficient, narrow band beams sufficient to penetrate the materials used in the semiconductor manufacturing arena.

In some embodiments, multiple illumination sources may be used simultaneously to increase throughput by using different wavelengths focused at different levels or planes. For example, in FIG. 4, a second illumination source 450 is optionally depicted in the metrology system 400. The second illumination source 450 produces a second illumination beam 452 that travels a similar path as the illumination beam 428 produced by the illumination source 402 except focused at a different plane 460 of, for example, a stacked chip 462 and the like. The scanner 406 is typically a mechanically based scanner (e.g., galvanometer scanner or polygon scanner, etc.) when used in conjunction with multiple illumination sources. Acousto optic scanners are optimized for single wavelengths and the angle of the acousto optic scanner would need time to shift to be compatible with a second wavelength which would impact throughput. The two different wavelengths would also cause different scanning rates when using the acousto optic scanner. Shifting away from the Bragg angle for a particular frequency would also reduce light reflections back to the detectors. Multiple acousto optical scanners would be needed for multiple illumination sources to avoid the angle adjustment issue, increasing costs and complexity of the metrology system 400. The second illumination beam 452 induces a second reflection beam 454 which travels back to a second detector 458 via a second splitter 456. Any number of multiple sets of illumination sources, detectors, splitters, sets of optics, or scanners may be used in the implementation of the metrology system 400.

The data streams obtained by the metrology system 400 may be analyzed in two stages. In the first stage, the raw data (i.e., the stream of photon counts coming from the detector 440) are reformed into an image and analyzed to extract overlay parameters. Standard machine vision fiducial recognition algorithms can be used (e.g., image registration and template matching and the like). The second stage of analysis is associated with how the extracted overlay measurements relate to various process tool parameters. For example, sub-optimal parameter tuning in an upstream step may manifest as greater misalignment of coupons towards the edge of the wafer. As another example, location-dependent misalignment can correlate to pressure profiles used during a bonding step in a bonding process. Machine learning can also be used in the context of an integrated packaging tool with on-board metrology capabilities that have the ability to establish relationship types.

In some embodiments, a first controller 420 may be used to enable data collection and feedback from the respective apparatus of the metrology system 400 to optimize performance of the metrology system 400 as well as control of the system apparatus (e.g., scanning patterns, scanning control, scanning locations, etc.). The first controller 420 generally includes a Central Processing Unit (CPU) 422, a memory 424, and a support circuit 426. The CPU 422 may be any form of a general-purpose computer processor that can be used in an industrial setting. The support circuit 426 is conventionally coupled to the CPU 422 and may comprise a cache, clock circuits, input/output subsystems, power supplies, and the like. Software routines, such as a method for controlling the metrology system 400 as described above may be stored in the memory 424 and, when executed by the CPU 422, transform the CPU 422 into a specific purpose computer (first controller 420). The software routines may also be stored and/or executed by a second controller (not shown) that is located remotely from the metrology system 400.

In some embodiments, the first controller 420 may be in communication with the illumination source 402 to alter the illumination wavelength and/or power and the like, the beam forming optics 404 to shape the illumination beam, the scanner 406 to increase or decrease a scanning rate and/or a scanning width, the focusing objective 410 to position and focus the illumination beam at a location on the substrate/chip, and the detector 440 to generate high-resolution images by altering algorithm types and the like. For hybrid bonding applications, precision positioning of the pixels in the obtained images is very important. The first controller 420 enables control over the sweep of the illumination beam via the scanner 406 to obtain precision positioning. The first controller 420 may also be in communication with the store 438 and/or the alignment correlator 446 to further enhance the metrology data gathering process. The first controller 420 may also be in communication with the actuator 416 of the substrate support 414 to enable X direction and Y direction movement to produce scanning swaths as discussed above. The first controller 420 may also alter the scanning locations on the substrate/chip as required by commanding the actuator 416 to move to different locations. The first controller 420 may also communicate with the scanner 406 and the actuator 416 in concert to enable a desired scanning pattern and the like. One skilled in the art will understand that other ancillary apparatus (e.g., additional optics, power sources, etc.) may be used in conjunction with the metrology system 400, and the first controller 420 may also be in communication with the ancillary apparatus.

The description of the metrology system 400 has been given in conjunction with a single scanning spot architecture. However, multi-spot arrangements can also be used, where the sample (e.g., substrate, chip, etc.) is simultaneously interrogated by many spots. Multi-spot configurations may use trains of chirped acoustic signals in a long scan or may use many short span scanning spots made possible with a diffractive optical element. In such systems, a detector (e.g., detector 440) is used for each scanning spot. The electronics and computation requirements are more complex, but the throughput of the system goes up proportionally to the number of scanning spots.

Figure 7:
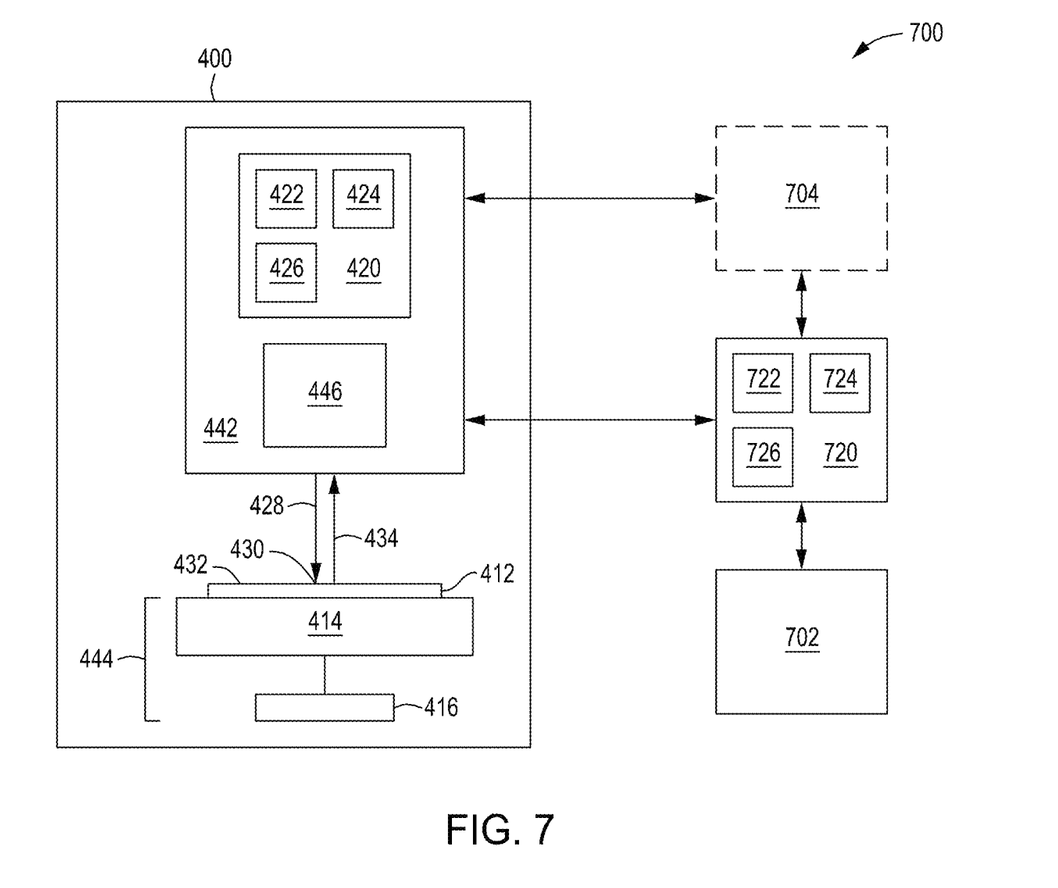
FIG. 7 depicts a cross-sectional view of a metrology system in communication with a hybrid bonder to enable alignment feedback in accordance with some embodiments of the present principles.

The metrology system 400 may be used in conjunction with a hybrid bonder 702 to improve the hybrid bonding alignment process as depicted in a view 700 of FIG. 7. The hybrid bonder 702 is typically controlled by a third controller 720. The third controller 720 may be used to enable data collection and feedback/feedforward from the first controller 420 of the metrology system 400 to optimize performance of the hybrid bonder 702. The third controller 720 generally includes a Central Processing Unit (CPU) 722, a memory 724, and a support circuit 726. The CPU 722 may be any form of a general-purpose computer processor that can be used in an industrial setting. The support circuit 726 is conventionally coupled to the CPU 722 and may comprise a cache, clock circuits, input/output subsystems, power supplies, and the like. Software routines, such as a method for controlling the alignment of bonding substrates and/or chips may be stored in the memory 724 and, when executed by the CPU 722, transform the CPU 722 into a specific purpose computer (third controller 720). The software routines may also be stored and/or executed by a fourth controller (not shown) that is located remotely from the hybrid bonder 702.

In some embodiments, the metrology system 400 may directly communicate with the third controller 720 to relay alignment information to the hybrid bonder 702 such that subsequent bonding processes have improved alignment errors. The feedback/feedforward from the metrology system 400 may be in real-time or at scheduled intervals. In some embodiments, the alignment correlator 446 of the metrology system 400 may transmit actual alignment error data and values such as, but not limited to, alignment offsets for each fiducial and/or an angular rotation error value for a given type of chip and/or the location of the chip or chips. To facilitate in enhancing the value of the alignment information, the metrology system 400 may incorporate machine learning to augment the image data processing in, for example, but not limited to, the detector 440, the alignment correlator 446, and/or the first controller 420. In some embodiments, an alignment image data processor 704 may be used along with machine learning to interpret the alignment information and/or data information from the metrology system 400 in order to correlate the alignment errors to changes required in the hybrid bonder 702 to reduce or eliminate subsequent bonding alignment errors. As such, for example but not limited to, the machine learning may account for alignment shift data, alignment rotational errors, and the like and determine, for example but not limited, the capabilities of the hybrid bonder 702 to reduce/eliminate the errors. For example, the machine learning may account for the hybrid bonder's application pressure, amount of vacuum used to pick up the chips, and/or tolerances of the mechanical apparatus used to position a chip on a substrate and the like in order to decrease alignment errors by the hybrid bonder.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for detecting metrology data, comprising:
a source using a laser configured to illuminate a focal point through silicon, wherein the source uses only a single wavelength that is greater than 1100 nm and configured with sufficient light penetration into the silicon at a desired focal plane within the silicon to generate a diffraction-limited focus for subsurface imaging;
an optical lens configured to form an illumination beam when illuminated by the source;
an acousto-optic scanner configured to move the illumination beam back and forth in a scanning pattern;
a splitter configured to allow the illumination beam to be directed at a metrology sampling location while allowing a reflection beam caused by the illumination beam to pass through the splitter to a detector;
a set of optics configured to focus the illumination beam at a focal point in a Z direction to obtain subsurface images; and
a substrate platform configured to hold a substrate and to move the substrate in an X direction and a Y direction based on a metrology data acquisition pattern,
wherein the apparatus is configured to obtain metrology data for a semiconductor packaging process.

2. The apparatus of claim 1, wherein the set of optics is further configured to focus at more than one focal point in the Z direction to obtain subsurface images at a plurality of focal planes.

3. The apparatus of claim 1, wherein the substrate platform is configured to move in an X direction while the acousto-optic scanner moves the illumination beam back and forth to form a scanning swath and is configured to move in the Y direction when a scanning swath is completed.

4. The apparatus of claim 1, wherein the apparatus is configured with an illumination beam splitter and multiple sets of acousto-optic scanners, splitters, and sets of optics configured to obtain metrology data from multiple locations on the substrate simultaneously.

5. The apparatus of claim 1, further comprising:
a controller in communication with the acousto-optic scanner and the set of optics and configured to automatically adjust the scanning pattern and a focus based on an amount of metrology data for a particular location on the substrate.

6. The apparatus of claim 1, wherein the semiconductor packaging process is a hybrid bonder.

7. The apparatus of claim 1, wherein the set of optics includes correction for spherical aberrations caused by the illumination beam passing through at least one surface plane.

8. The apparatus of claim 1, wherein the acousto-optic scanner is configured to operate in a dual chirped mode.

9. A system for correcting packaging alignment errors, comprising:
an apparatus for detecting metrology data including:
at least one source using a laser configured to illuminate a focal point through silicon, wherein a wavelength of the source is configured to generate a diffraction-limited focus for subsurface imaging;
at least one optical lens configured to form at least one illumination beam when illuminated by the at least one source;
at least one scanner configured to move the at least one illumination beam back and forth in a scanning pattern;
at least one splitter configured to allow the at least one illumination beam to be directed at a metrology sampling location while allowing at least one reflection beam caused by the at least one illumination beam to pass through the at least one splitter to at least one detector;
at least one set of optics configured to focus the at least one illumination beam at one or more focal planes in a Z direction to obtain subsurface images; and
a substrate platform configured to hold a substrate and to move the substrate in an X direction and a Y direction based on a metrology data acquisition pattern,
wherein the apparatus is configured to obtain metrology data for a semiconductor packaging process;
a first controller in communication with the at least one scanner and the at least one set of optics and configured to automatically adjust the scanning pattern and a focus based on an amount of metrology data for a particular location on the substrate;
the at least one detector configured to receive the at least one reflection beam and generate subsurface images;
an alignment correlator in communication with the at least one detector and configured to determine alignment errors from the subsurface images from the at least one detector; and
a second controller in communication with a hybrid bonder and configured to adjust alignment of chips on the substrate based on the alignment errors from the alignment correlator.

10. The system of claim 9, wherein the second controller is configured to adjust a pressure of the hybrid bonder based on the alignment errors.

11. The system of claim 9, wherein the alignment correlator is configured to use machine learning to determine the alignment errors.

12. The system of claim 9, wherein the second controller is configured to use machine learning to determine adjustments for the hybrid bonder based on the alignment errors.

13. The apparatus of claim 9, wherein the wavelength of the source is selected from wavelengths greater than 1100 nm.

14. The apparatus of claim 9, wherein the substrate platform is configured to move in an X direction while the scanner moves the illumination beam back and forth to form a scanning swath and is configured to move in the Y direction when a scanning swath is completed.

15. The apparatus of claim 9, wherein the apparatus is configured with at least one illumination beam splitter and multiple sets of scanners, splitters, and sets of optics configured to obtain metrology data from multiple locations on the substrate simultaneously.

16. The apparatus of claim 9, wherein the at least one set of optics includes correction for spherical aberrations caused by the at least one illumination beam passing through at least one surface plane.

17. The apparatus of claim 9, wherein the at least one scanner is an acousto-optic scanner which is configured to operate in a dual chirped mode.

18. An apparatus for detecting metrology data, comprising:
- a source using a laser configured to illuminate a focal point through silicon, wherein the source uses only a single wavelength that is greater than 1100 nm and configured with sufficient light penetration into the silicon at a desired focal plane within the silicon to generate a diffraction-limited focus for subsurface imaging;
- an optical lens configured to form an illumination beam when illuminated by the source;
- an acousto-optic scanner configured to move the illumination beam back and forth in a scanning pattern;
- a splitter configured to allow the illumination beam to be directed at a metrology sampling location while allowing a reflection beam caused by the illumination beam to pass through the splitter to a detector;
- a set of optics configured to focus the illumination beam at one or more focal points in a Z direction to obtain subsurface images, wherein the set of optics includes correction for spherical aberrations caused by the illumination beam passing through at least one surface plane;
- a substrate platform configured to hold a substrate and to move the substrate in an X direction and a Y direction based on a metrology data acquisition pattern; and
- a controller in communication with the acousto-optic scanner and the set of optics and configured to automatically adjust the scanning pattern and a focus based on an amount of metrology data for a particular location on the substrate,
- wherein the apparatus is configured to obtain metrology data for a hybrid bonder in a semiconductor packaging process.

19. The apparatus of claim 18, wherein the substrate platform is configured to move in an X direction while the acousto-optic scanner moves the illumination beam back and forth to form a scanning swath and is configured to move in the Y direction when a scanning swath is completed.

20. The apparatus of claim 18, wherein the apparatus is configured with an illumination beam splitter and multiple sets of acousto-optic scanners, splitters, and sets of optics configured to obtain metrology data from multiple locations on the substrate simultaneously or wherein the acousto-optic scanner is configured to operate in a dual chirped mode.

* * * * *